(12) United States Patent
Achter et al.

(10) Patent No.: US 7,835,189 B2
(45) Date of Patent: Nov. 16, 2010

(54) HIGH ACCURACY ADAPTIVE PROGRAMMING

(75) Inventors: Michael Achter, Mountain View, CA (US); Hagop Nazarian, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 794 days.

(21) Appl. No.: 11/687,492

(22) Filed: Mar. 16, 2007

(65) Prior Publication Data

US 2008/0225596 A1 Sep. 18, 2008

(51) Int. Cl.
*G11C 16/06* (2006.01)

(52) U.S. Cl. .............................. 365/185.22; 365/185.17

(58) Field of Classification Search ............ 365/185.22, 365/185.17
See application file for complete search history.

(56) References Cited

U.S. PATENT DOCUMENTS

2005/0083735 A1* 4/2005 Chen et al. ............. 365/185.17

* cited by examiner

*Primary Examiner*—Hoai V Ho
*Assistant Examiner*—Jay Radke
(74) *Attorney, Agent, or Firm*—Turocy & Watson, LLP

(57) ABSTRACT

Flash memory devices have a plurality of memory cells that can be erased and programmed. Performing a voltage verification check allows a for an appropriate state-change voltage to be applied to the flash memory device. The appropriate state-change voltage is determined though accessing a look-up table. Using an appropriate state-change voltage allows a cell to operate with more overall programming cycles.

20 Claims, 13 Drawing Sheets

| TIME DURATION | | | | | | |
|---|---|---|---|---|---|---|
| <8ns | 20V | 30V | 30V | 30V | 30V | |
| 7ns | 20V | 20V | 30V | 30V | 30V | |
| 6ns | 20V | 20V | 20V | 30V | 30V | |
| 5ns | 20V | 20V | 20V | 20V | 30V | |
| 4ns | 10V | 20V | 20V | 20V | 20V | |
| 3ns | 10V | 10V | 20V | 20V | 20V | |
| 2ns | 10V | 10V | 10V | 20V | 20V | |
| >1ns | 10V | 10V | 10V | 10V | 20V | |
| | >1V | 2V | 3V | 4V | <4V | |
| | CELL COMPONENT VOLTAGE | | | | | |

FIG. 3

HIGH ACCURACY ADAPTIVE PROGRAMMING

TECHNICAL FIELD

The subject specification relates generally to flash memory devices and in particular to application of state-change voltage to memory cells.

BACKGROUND

Recent advancements have been made in the storage of digital information. Digital memory allows information to be stored as a series of I/Os. Various different memory types are available, including read-only memory (ROM), random access memory (RAM), and electrically erasable programmable read only memory (EEPROM). ROM suffers from that drawback that it can be written to only once. RAM suffers from the drawback that most types are volatile, meaning that RAM loses information unless it is supplied with a constant source of power. EEPROM has a relatively high manufacturing cost that makes it unsuitable for personal applications and devices.

One type of digital storage that allows for reading, erasing, and re-writing is flash memory. In addition, flash memory is non-volatile and relatively cheap to mass-manufacture. This allows users to implement flash memory devices in an array of personal applications. For example, a user can attach a flash memory device to a cellular telephone equipped with a camera. A digital picture can occupy a large amount of memory, so it can be beneficial to store the digital picture on the flash memory device. The flash memory device can then be removed and inserted into a device with a large memory, (e.g., a personal computer). The digital picture can transfer to the device with a large memory and erased from the flash memory device.

SUMMARY

The following presents a simplified summary of the specification in order to provide a basic understanding of some aspects of the specification. This summary is not an extensive overview of the specification. It is intended to neither identify key or critical elements of the specification nor delineate the scope of the specification. Its sole purpose is to present some concepts of the specification in a simplified form as a prelude to the more detailed description that is presented later.

One benefit of using flash memory is the ability to keep information stored for a long duration of time. In addition, flash memory allows a single cell to be re-written a plurality of times. Therefore, it is important that a flash memory cell be kept in the best condition possible. If a cell is not maintained in an adequate condition, then it can lose stored information and be unsuitable for re-writes. The subject specification relates to applying state-change voltage to a memory cell while having minimum impact on cell structure. This is done through applying a verification voltage, looking up an appropriate state-change voltage based on the results of the verification voltage, and implementing the state-change voltage.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

FIG. 3 illustrates a representative look-up table in accordance with an aspect of the subject specification.

DETAILED DESCRIPTION

Figure 1:
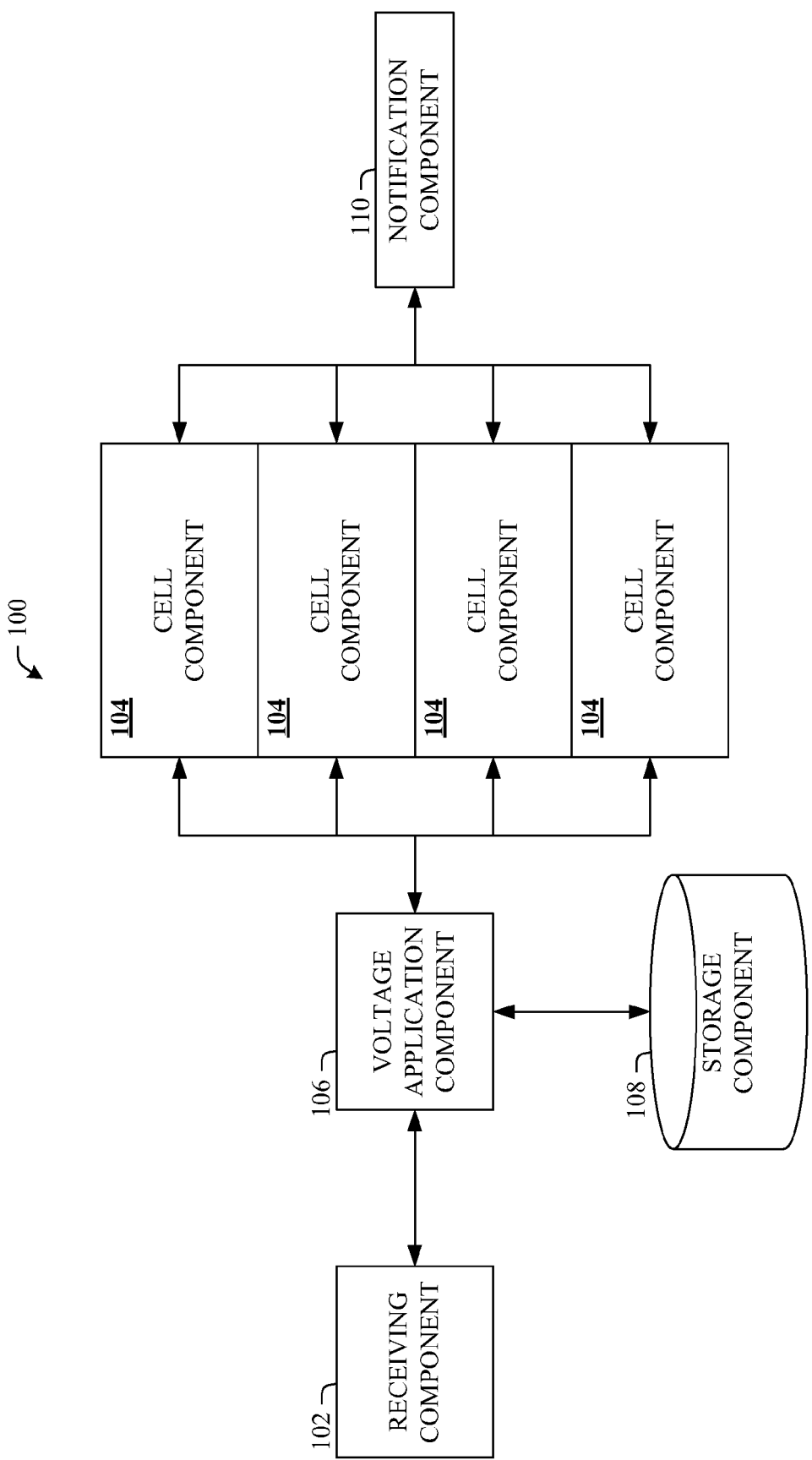
FIG. 1 illustrates a representative flash memory device in accordance with an aspect of the subject specification.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

As used in this application, the terms "component," "module," "system", "interface", or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. As another example, an interface can include I/O components as well as associated processor, application, and/or API components. In the subject specification, the terms "evaluation", "verification", and the like are to be used interchangeably.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

FIG. 1 discloses an example partial flash memory device 100. A receiving component 102 receives a command to perform a state change on cell component 104 located within the flash memory device 100. The command can originate from a number of different locations. For example, a user of an electronic device (e.g., cellular telephone) can attach the flash memory device 100 to the electronic device. From the electronic device, the user can instruct for a state change in at least one cell component 104. In another example, an internal structure of a flash memory device 100 (e.g., a control unit) can send a command for a state change in at least one cell component 104. There can be an automated function wherein if information is not accessed after a specific period (e.g., six months), then a command generates to erase information from a relevant cell component 104.

A voltage application component 106 applies voltage and/or current to at least one cell component 104. The voltage can apply to a drain or to a source of a cell component 104. Applied voltages come in several different types. A first type is a verification voltage and the second type is a state-change voltage. The verification voltage determines information about each cell component 104. The state-change voltage provides enough voltage to modify the state of the cell component 104. Two common state changing actions are programming and erasing. However, information disclosed in the subject specification can relate to non-state change applications, such as reading the cell component 104.

In common manufacturing, cell components 104 in a flash memory device 100 are not made equally. Therefore, each cell component 104 has different individual characteristics that should be taken into account when applying a state-change voltage. If too hard of a voltage is applied to a cell component 104, it could damage or destroy the cell component 104. Therefore, the voltage application component 106 attempts to determine a proper voltage to apply to the cell component 104 without damage. Voltages can apply to a source portion or to a drain portion of the cell component 104.

A storage component 108 contains a look-up table for use by the voltage application component 106. When a verification voltage acts upon a cell component 104, the voltage rises on the cell component 104 to a specific level over a period. There is commonly a known threshold voltage for each cell component 104. Based on the threshold voltage and the period it took for the voltage to rise on the cell component 104, the look up table contains information on what voltage to apply for a safe state change (e.g., a voltage application that applies a low level of damage to the cell component 104). In one embodiment, the cell components 104 are quad-bit cell components 104, meaning that they can contain four bits of information. The storage component 108 can be a set of cell component 104 or it can be independent in structure.

Each time a state-change voltage is applied to a cell component 104 there can be a change in cell component 104 characteristics. Therefore, the look-up table can change its contents based on each state change of an individual cell component 104. The look-up table contains individual information on each cell component 104 independent of other cell components 104. Therefore, one look-up table likely has one page for each cell component 104 and the pages contain characteristic information about the cell component 104. However, it is possible that two cells are exactly alike, therefore there can be less pages than the number of cell components 104. References to the cell component 104 in the subject specification should be applicable to each cell component 104 disclosed herein.

A notification component 110 sends announcement about the operations of the flash memory device 100. In one embodiment, the notification component 110 sends information about the operation to an electronic device. In another embodiment, the notification component 110 sends a back-up copy of the look-up table to the electronic device. In a further embodiment, the notification component 110 and the receiving component 102 integrate together.

Figure 2:
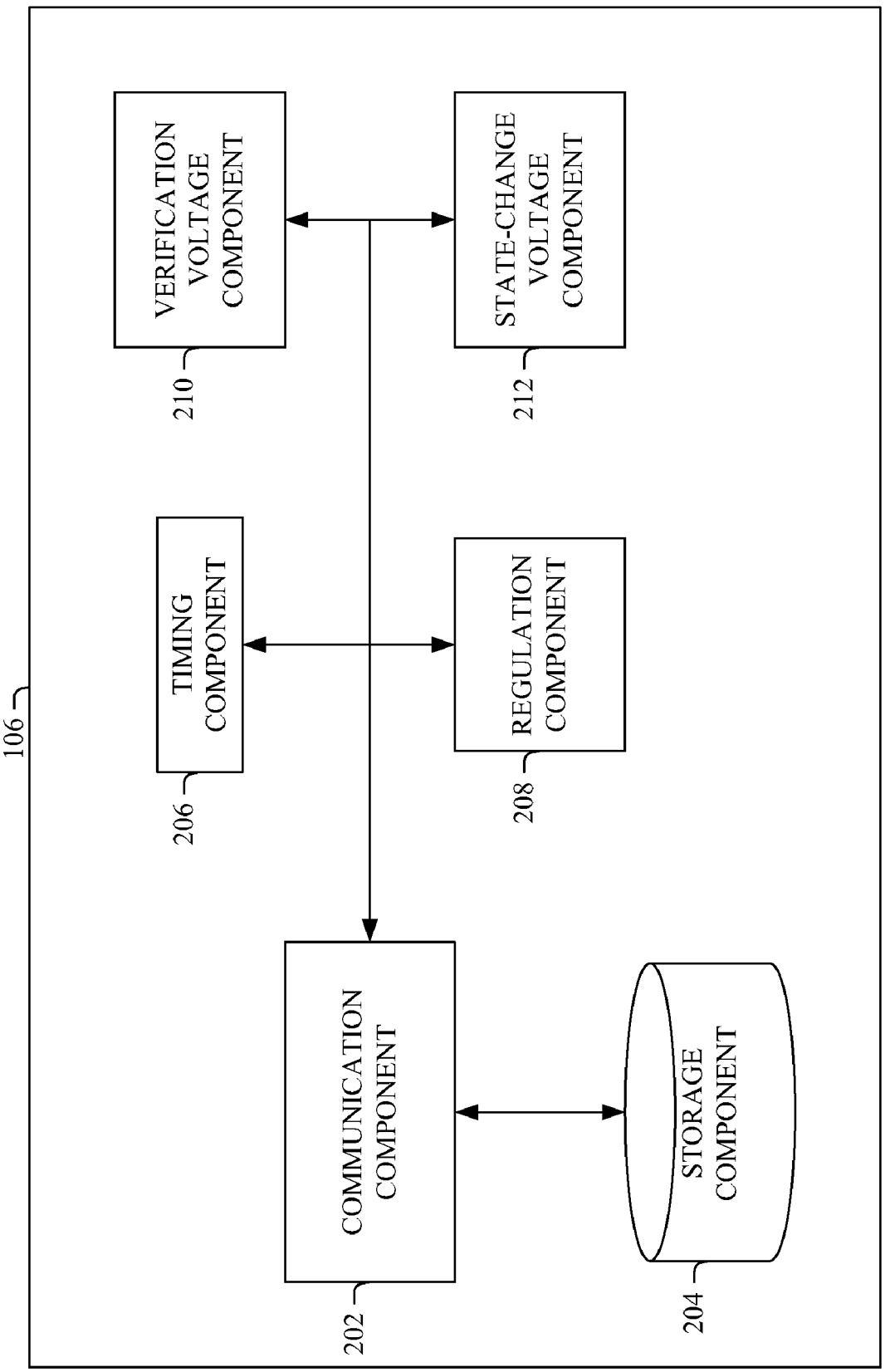
FIG. 2 illustrates a representative voltage application component in accordance with an aspect of the subject specification.

FIG. 2 discloses an example voltage application component 106. A communication component 202 functions to interconnect the voltage application component 106 with other components of the flash memory device 100 of FIG. 1. In addition, the communication component 202 can communicate outside of the flash memory device 100 of FIG. 1. For example, the communication component 202 can communicate wirelessly with an auxiliary device (e.g., a server).

The communication component 202 has access to a storage component 204. The storage component 204 can be used for a variety of different purposes. For example, each time the communication component 202 receives a command, an entry can be made into the storage component 204. Furthermore, components within the voltage application component 106 can rely on information stored in the storage component 204. For example, there can be an Internet Protocol (IP) address in which the communication component 202 is to send information. The IP address can be stored in the storage component 204 for later use. It is to be appreciated that while the storage component 204 is shown only directly connecting to the communication component 202, the storage component 204 can be accessed by other components in the voltage application component 106. The storage component 204 can be a set of cell component 104 of FIG. 1 or it can be independent in structure.

A timing component 206 keeps a record of the duration of events related to the voltage application component 106. For example, during an application of voltage and/or current for verification, it can be determined what voltage is reached after a specific amount of time. The timing component 206 allows a system to keep track of how long a voltage is applied. The timing component 206 can assist other components in the voltage application component 106. For example, the timing component 206 can determine how long it takes the communication component 202 to send information to an auxiliary component. Information gathered by the timing component 206 can be stored in the storage component 204 for diagnostic purposes.

A regulation component 208 can assist in coordinating various components within the voltage application component 106. For example, the regulating component 208 can make sure that two voltages are not applied at the same time. The regulating component can block of a verification voltage component 210 when a state-change component 212 is in operation. In addition, the regulation component 208 can have a stop function. The stop function can be a feature that forces a state-change voltage component to stop if the voltage level becomes too high. For example, the storage component 204 can hold absolute voltage levels that are known to damage automatically a cell component 104 of FIG. 1 (e.g., a voltage over 10V). If the state-change voltage component 212 is applying a voltage that nears an upper limit (e.g., 9.5V), then the regulation component 208 can automatically shut-down the state-change voltage component 212 so there is minimal or no damage.

A verification voltage component 210 applies a verification voltage, commonly to all cell components that will have their state changed. The verification voltage is commonly applied for a specific period, which is synchronized by the timing component 206. Results of the verification voltage transfer to a state-change voltage component 212. The verification voltage component 210 can run several iterations on each cell component. A first iteration applies the same voltage to each cell component. Further iterations can be different voltages and determine specific characteristics of each cell component.

A state-change voltage component 212 applies a specific voltage to each cell component that will have a state change. The state-change voltage component 212 can configure to apply different voltages to each cell component. Based on information received from the verification voltage component 210, the state-change voltage component 212 can perform a look-up to determine what voltage to apply to each cell component. The look-up can be reference to an updatable table located in a storage component.

After a state-change, further verifications can take place and a comparison can be made between pre-state change characteristics and post-state change characteristics of a cell component. Based on the difference, values in a look-up table used to apply state-change voltage can be modified to reflect up-to-date characteristics of a cell component. In another embodiment, the verification voltage component 210 performs a look-up as to what voltage the state-change component 212 should apply to the cell component. This information is transferred to the state-change voltage component 212 and applied.

FIG. 3 discloses an example look-up table 300 for use by the voltage application component 106 of FIG. 1. This look-up table 300 discloses time duration against a cell component voltage. A verification voltage is applied at after a certain period of time a voltage on the cell component reaches a specific level. For each cell component 104 of FIG. 1 a threshold voltage is known, which is a voltage that changes the state of the cell component 104 of FIG. 1.

For example, after four nanoseconds (ns), the cell component 104 of FIG. 1 is two volts (V). Therefore, using the table, the state-change voltage that should be applied to the cell component 104 of FIG. 1 should be 20V. The numbers disclosed are for example purposes and not intended to represent characteristics of any actual cell component. It is to be appreciated that a look-up table can contain other information for use in determining an applicable voltage.

Figure 4:
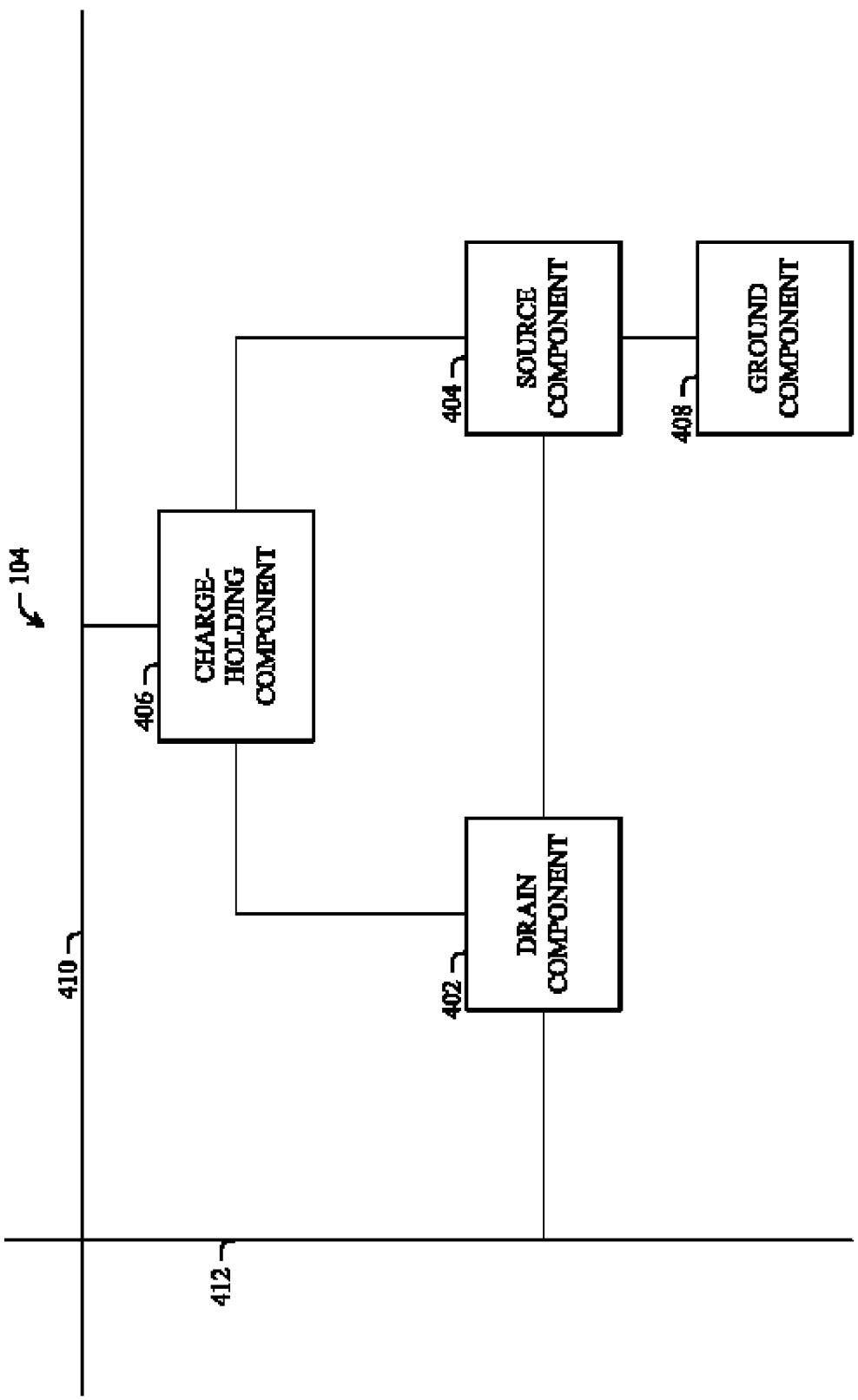
FIG. 4 illustrates a representative cell component in accordance with an aspect of the subject specification.

FIG. 4 illustrates an example cell component 104. Voltages applied by a voltage application component 106 of FIG. 1 can apply to either a drain component 402 or a source component 404, which connect to a charge-holding component 406. The cell component 104 is grounded through a ground component 408. In addition, a wordline 410 and a bitline 412 assist in holding information. In one embodiment, application of a verification voltage and/or state-change voltage takes place upon wordlines 410 of the cell component 104.

Application of a state-change voltage can change the state of a charge-holding component 406. For example, the charge-holding component 406 can be capable of holding four bits of information, thus being defined as a quad-bit cell component 104. If a voltage rises past certain threshold voltages, then electrons move to different portions and the state of the cell component 104 changes.

In common operation, the application of a verification voltage is low enough that it does not change the state of the charge-holding component 406. Based on the results of the verification voltage, a state-changing voltage is applied. The state-changing voltage is strong enough to move the electrons in the charge-holding component and thus change the state. The state-changing voltage is commonly a programming voltage that changes the state from 'OOOO' or an erasing voltage that changes the state to 'OOOO'.

Figure 5:
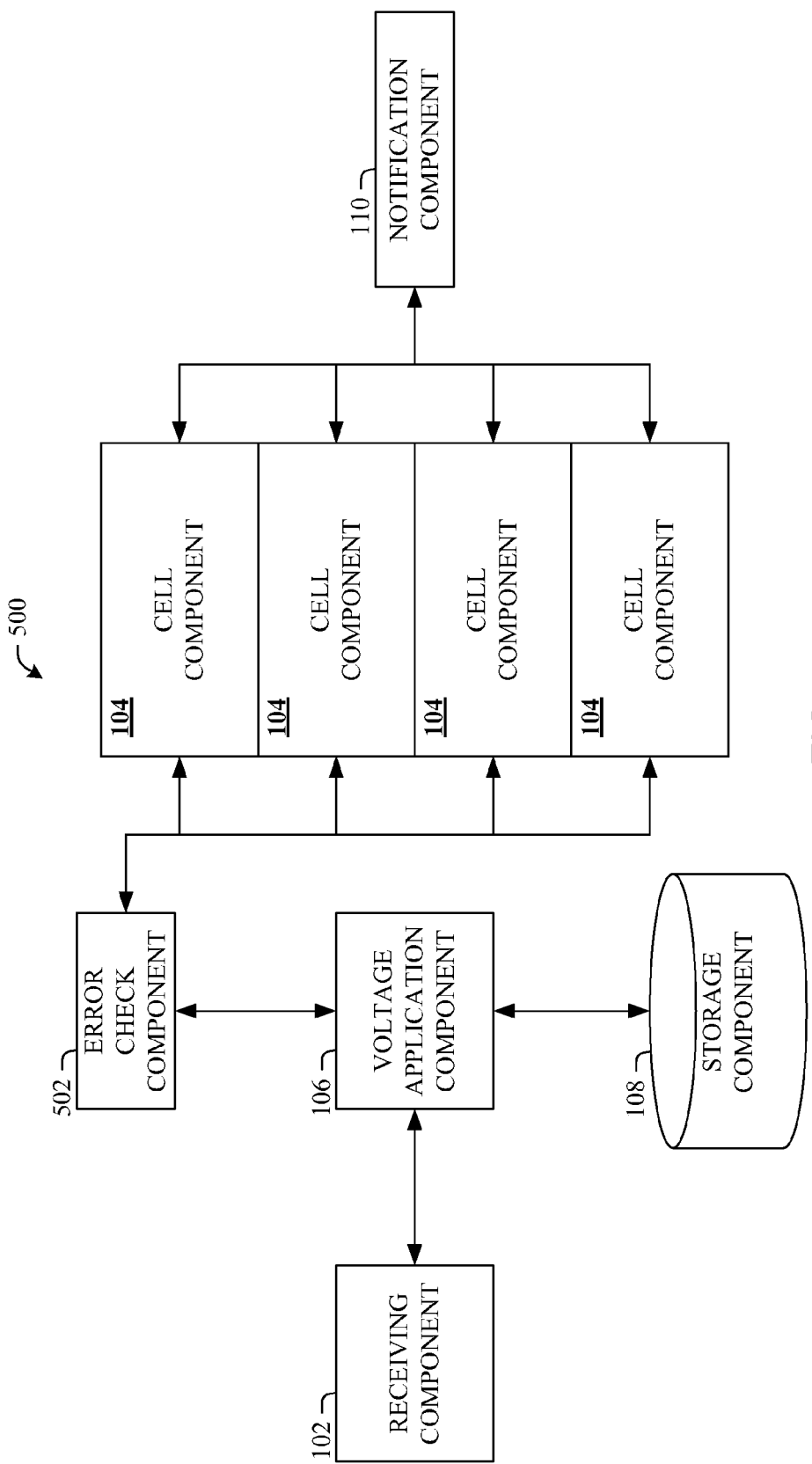
FIG. 5 illustrates a representative flash memory device in accordance with an aspect of the subject specification.

FIG. 5 discloses an example partial flash memory device 500 with an error-check component 502. A receiving component 102 can receive commands from an auxiliary source to change the state of at least one cell component 104. A voltage application component 106 applies a verification voltage and a state-change voltage to the cell component 104. According to one embodiment of the subject specification, the state-change voltage is determined by finding a related voltage based off a result of the verification voltage. The manner in which the state-change voltage is determined is through comparison of a look-up table located in a storage component 108. Information concerning the flash memory device 500 can be sent to other locations through a notification component 110.

An error check component 502 can determine errors in the flash memory device 500. The error check component 502 can check if a command received by the receiving component 102 is authorized to make a request. If the command is not authorized, then the error check component 502 can stop the request from taking place. In addition, the error check component 502 can determine if a command is corrupt (e.g., the command is authorized, but execution of the command will cause damage to the flash memory device 500). If the command is corrupt, then the error check component 502 can attempt to correct the command or the error check component 502 can block the command from executing.

In another embodiment, the error check component 502 can determine errors relating to the voltage application component 106. For example, there can be specific parameters in which the flash memory device 500 is to operate. The voltage application component 106 can accidentally send a voltage for verification that is too high and will change a state of the cell component 104. The error check component 502 can block the voltage from applying to the cell component 104 and attempt to rectify determined errors.

In a further embodiment, the error check component 502 can process errors relating to the storage component 108. For example, when the receiving component 102 attempts to store communication records in the storage component 108, they can be stored in a corrupted manner. The error check component 502 can determine this and stop a save from taking place and/or attempt to make a corrected save. In addition, the error check component can have diagnostic capabilities on component in the flash memory device 500. For example, the error check component can fix errors found about the receiving component 102. Furthermore, the error check component 502 can make a back up of the look-up table in case the storage component 108 loses stored information.

In another embodiment, the error check component 502 can operate upon errors relating to at least one cell component 104. For example, a cell component 104 can lose information (e.g., the state of the cell can change from '1011' to '1010'). The error check component 502 can attempt to determine why the information is being lost and attempt to fix the error. In addition, the error check component 502 can make a back up of any information lost and either store it internally or make a record in the storage component 108.

In a further embodiment, the error check component 502 can determine errors relating to the notification component 110. For example, the notification component 110 can incorrectly send information to a wrong location. This can be especially problematic if the information is confidential. The error check component 502 can determine there are wrong communications taking place and attempt to stop unauthorized communications.

Figure 6:
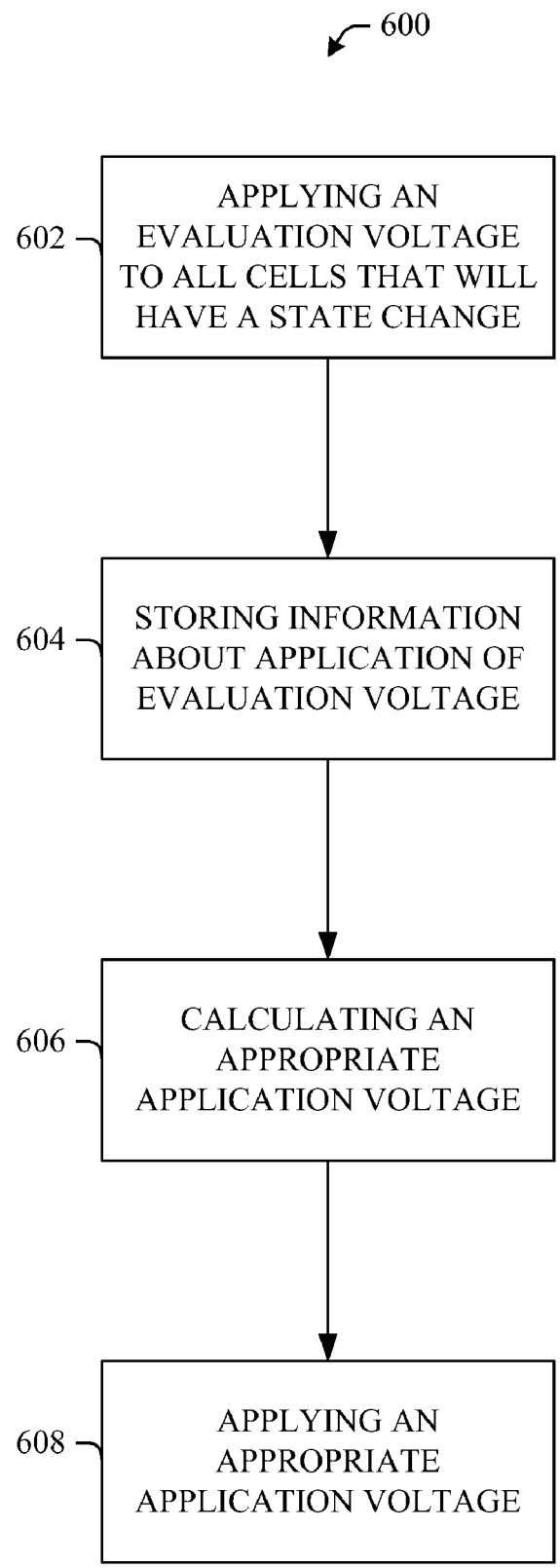
FIG. 6 illustrates a representative methodology relating to changing states of at least one flash memory cell in accordance with an aspect of the subject specification.

FIG. 6 discloses an example methodology 600 concerning changing the state of a cell. There is an application of an evaluation voltage to cells that will have a state change 602. Commonly, a command from an auxiliary device instructs a flash memory device as to which cell components should have a state change. This can include different amount of cells. For example, a command can enter stating there should be an erase of all cells in the flash memory device. In another example, a command could come in requesting the programming of information that will take half of the cells of the flash memory device.

Information about the application of the evaluation voltage is stored 604. Commonly a look-up table holds information about individual cells. There is a possibility that characteristics of a cell change when there is a state change. Therefore, information in the look-up table should be changed to represent up-to-date cell characteristics. Action 604 can store information in a look-up table and thus the look-up table can contain correct and up to date information about each cell of the flash memory device. This update can also take place later in the methodology.

There is a calculation of an appropriate application voltage 606. Based on the results of action 602, an appropriate application voltage can be determined from the look-up table. The look-up table can be similar to the table 300 in FIG. 3. An appropriate application voltage is applied upon relevant cells 608. The appropriate application voltage changes the state of the cells in accordance with a received command. There can also be error-checking actions for each event disclosed in the methodology 600.

Figure 7:
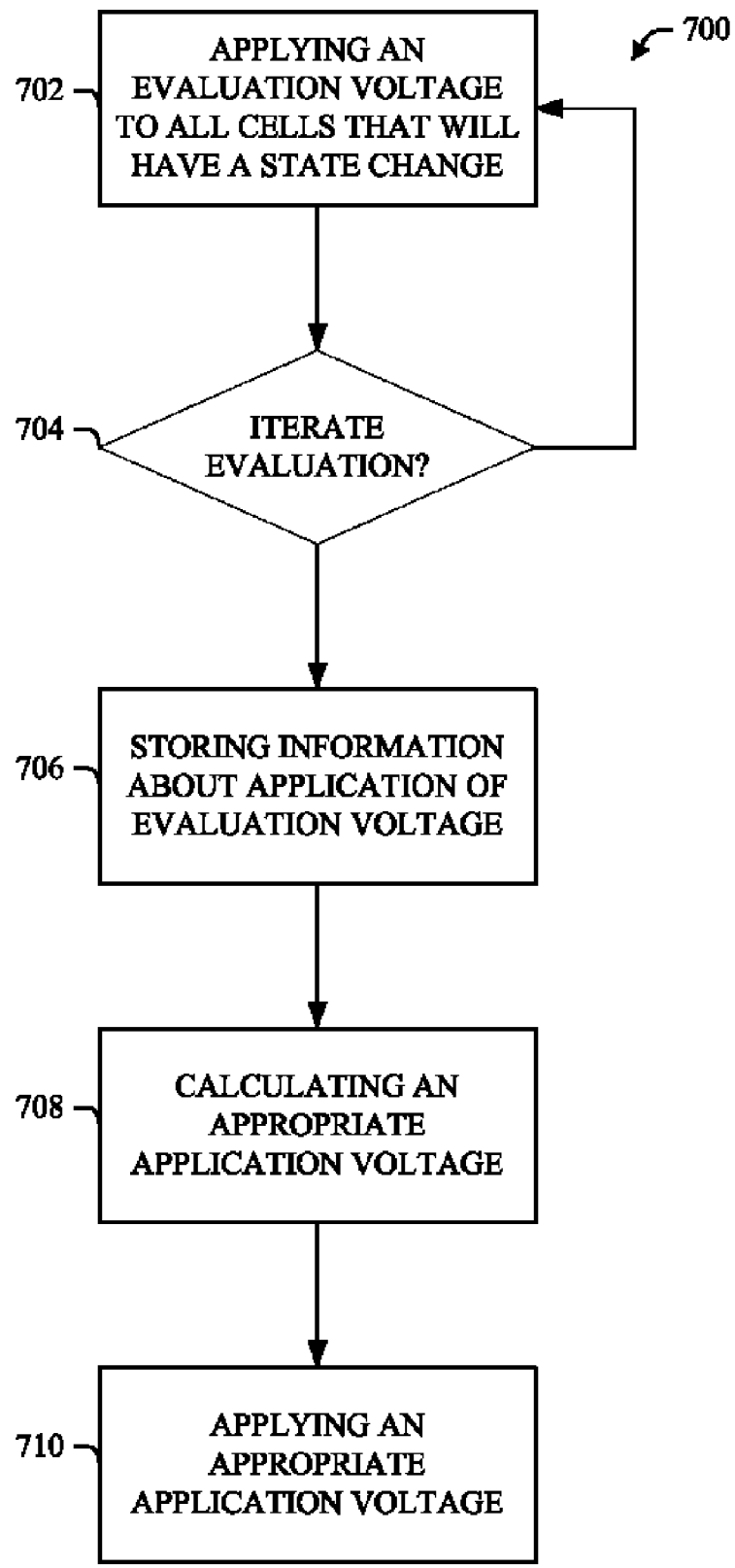
FIG. 7 illustrates a representative methodology relating to changing states of at least one flash memory cell in accordance with an aspect of the subject specification.

FIG. 7 discloses an example methodology 700 concerning changing the state of a cell. There can be an evaluation voltage applied to cells that will have a state change 702 later in the methodology 700. A command from within the flash memory device can instruct a flash memory device as to which cell components should have a state change. For example, a request can come from an auxiliary device to save information. However, cells in the flash memory device can be too full. Therefore, the flash memory device can intelligently perform an erase on cells in order to create room (e.g., deleting information that has not been accessed in a specific amount of time). This can include different amount of cells. For example, a command can automatically initiate stating there should be an erase of all cells in the flash memory device. In another example, a command could come in requesting the programming of information that will take half of the cells of the flash memory device.

Action 704 allows for iterations of a verification voltage. There are instances where a more specific verification voltage can be useful. For example, a voltage iteration provides a value that is on the border between two values in the look-up table. There can be another iteration of an evaluation voltage to determine more precisely how much voltage should be applied to change a state in a cell. Therefore, the methodology 700 returns to event 702 and reapplies an evaluation voltage. This can be the same voltage as run in a previous iteration or a different voltage.

Information about the application of the evaluation voltage is stored 706. Commonly a look-up table holds various data about cells. There is a possibility that characteristics of a cell change because of a state change. Due to shifts in characteristics from state changes, information in the look-up table should be changed in order to provide correct cell characteristics. Action 706 can store information in a look-up table and due to the storage; the look-up table can contain correct and up to date information about cells of the flash memory device. This update can also take place later in the methodology or can take place multiple times in the methodology.

There is a calculation of an appropriate application voltage 708. Based on the cell reaction from action 702, an appropriate application voltage can be determined by reference to the look-up table. The look-up table can be similar to the table 300 in FIG. 3. Relevant cells received an application of an appropriate voltage 710 (e.g., a voltage that changes the state of a cell to a desired cell). The appropriate application voltage changes the state of the cells in accordance with a received command. There can also be error-checking actions for each event disclosed in the methodology 700.

Figure 8:
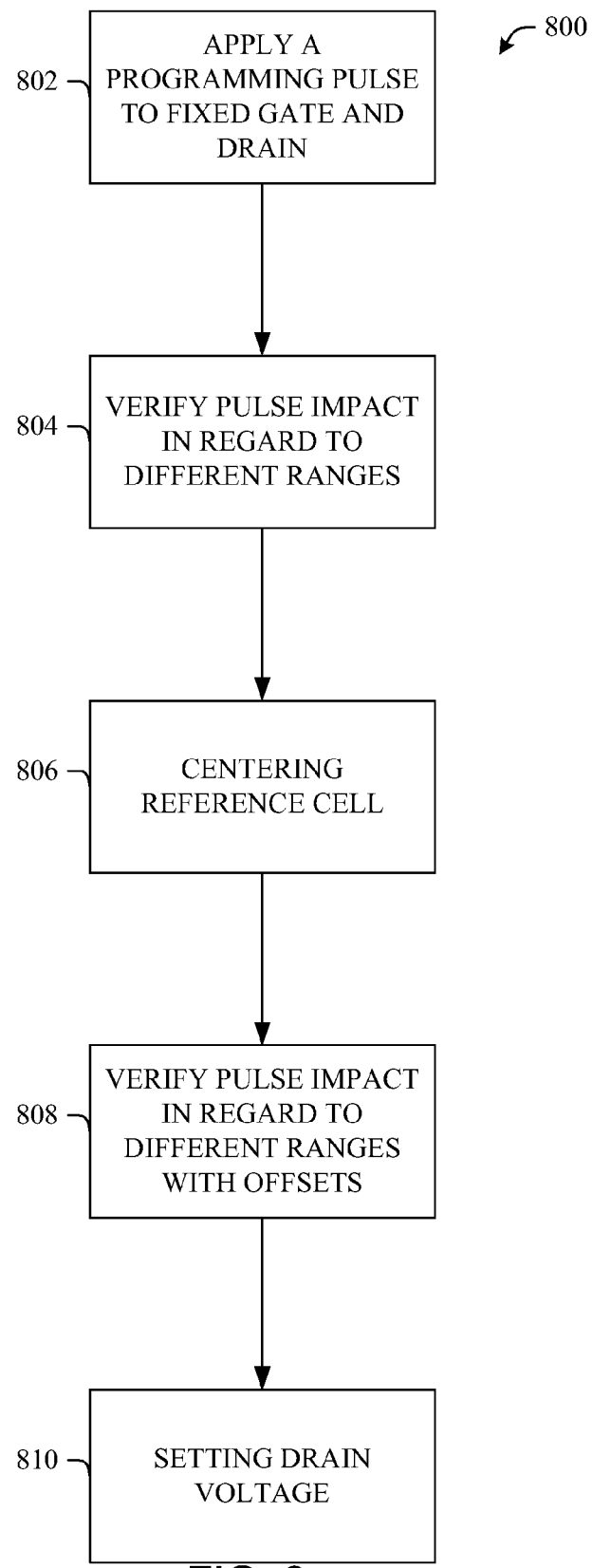
FIG. 8 illustrates a representative methodology relating to learning about at least one flash memory cell in accordance with an aspect of the subject specification.

FIG. 8 discloses an example methodology 800 of a verification voltage in preparation of an application of a state change voltage. While the disclosed methodology refers to a programming state change, the disclosed actions can also be for an erasing change or other types of state changes. The methodology allows the system to learn information about a cell component.

Action 802 applies a programming pulse to a fixed gate and drain. For example, a single pulse at a fixed gate and a drain to a data pattern on a wordline. The pulse should target bits less then a specific level. Event 804 verifies a wordline (e.g., reference cell wordline) in a specific range. For example, there can be four levels obtainable based on speed (e.g., level A-D, where A is slow and D is fast). Action 804 can include counting bits and determining a peak of distribution.

The wordline of a reference cell is centered 806. Centering takes place at a region found in action 804. For example, the pulse determined a location of B (e.g., after 'X' time, the voltage was at 'Y', where 'X' and 'Y' meet in region B at point 'Z'). A new range is determined with offsets (e.g., point 'Z'+/−a factor). Verify pulse impact regarding a determined range with offsets 908. A drain voltage is set based on previous actions 910.

Figure 9:
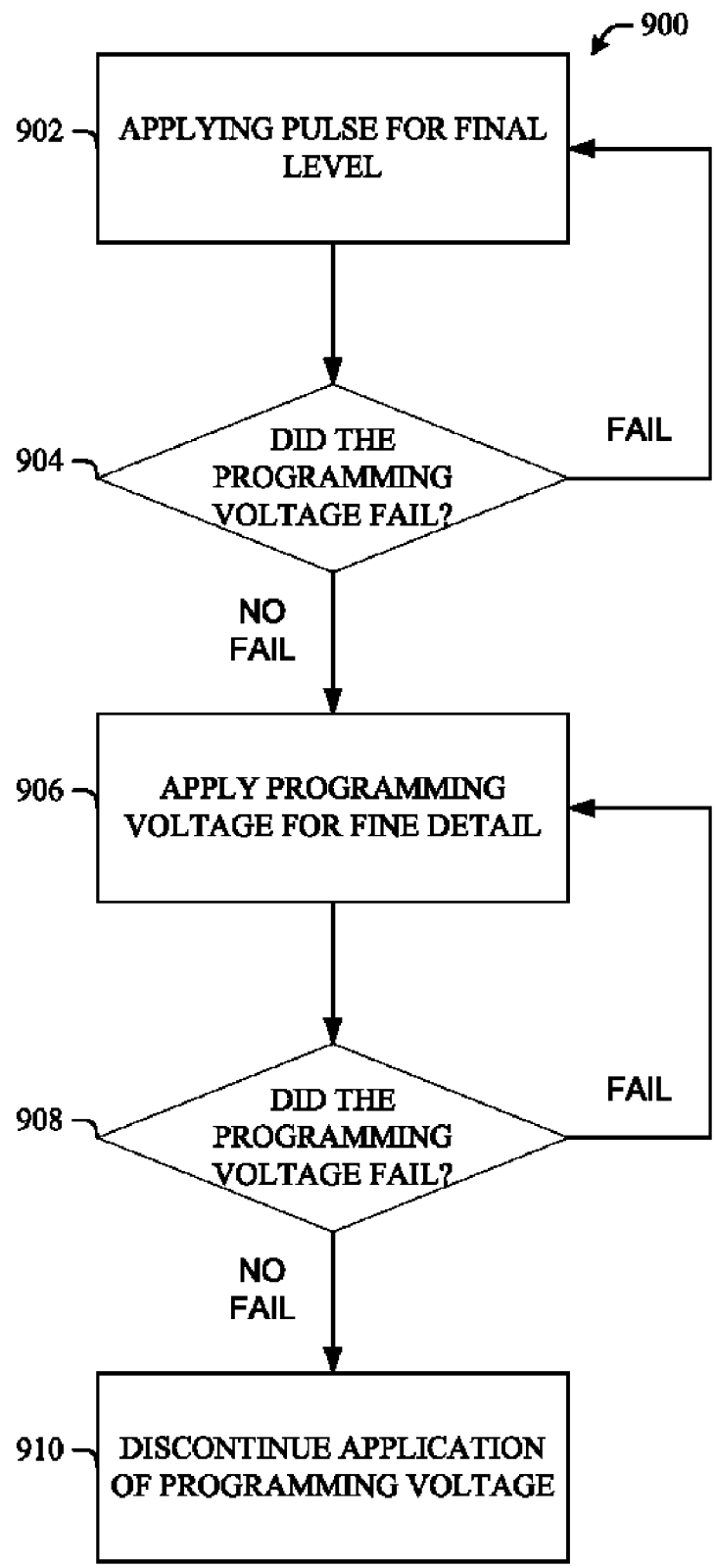
FIG. 9 illustrates a representative methodology relating to changing states of at least one flash memory cell in accordance with an aspect of the subject specification.

FIG. 9 discloses an example methodology 900 of changing a state of a cell component. While the disclosed methodology refers to a programming state change, the disclosed actions can also be for an erasing change or other types of state changes. The methodology allows the system to state-change (e.g., program) information about a cell component.

A pulse with an appropriate drain voltage is applied for a final level 902. Action 902 can include having a state change pulse with an appropriate drain voltage and running a verification at multiple levels (e.g., three levels). A check is performed to determine if the pulse failed 904. If the pulse failed (e.g., was not at a specific level), then the methodology 900 returns to action 902 to apply a slightly different voltage. The check 904 repeats until a pulse allows a cell to reach roughly a specific level. A fine detail programming voltage is applied 906. Action 906 can include a verification check to determine a fine level. Another check takes place to determine if there was a failure 908. If a failure occurs, then action 906 is repeated with a slight variation in voltage. Similar to check 904, the check reiterates until the voltage does not fail. Once an appropriate fine voltage is obtained, the application of a state change voltage and/or verification voltage stops 910.

For example, a cell can be applied with a voltage 1V that it expects to change correctly a cell state without causing damage. However, the voltage ramps the cell too quickly and may cause damage. Therefore, a new voltage is applied, 0.7V, to the cell, which places the cell in condition that is more desirable. When the cell reaches near its desired state, a fine voltage is applied, 0.731V to attempt to reach the correct state. However, 0.731V may change too slowly, so it is increased to 0.738V. Once the cell reaches an appropriate state, it stops operation. Methodology 800 and methodology 900 can be integrated together into a single methodology.

Figure 10:
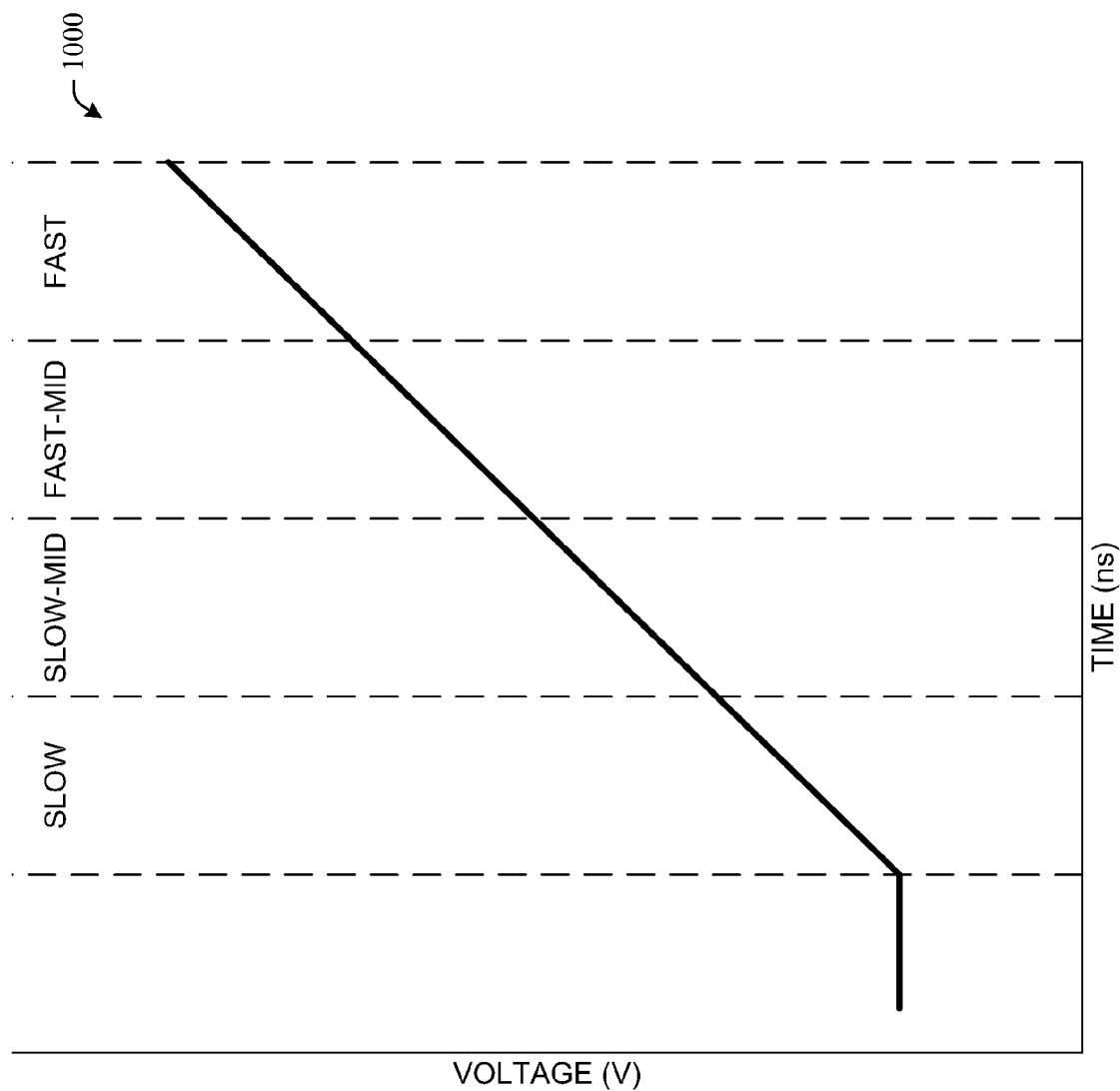
FIG. 10 illustrates a representative graphical representation of cell analysis in accordance with an aspect of the subject specification.

FIG. 10 is a graphical representation of rough voltage application 1000. A voltage is applied to a cell over a period. This graph represents voltage as a function of time. The graph is divided into four different groups of time: slow, slow-mid, fast-mid, and fast. A timing component can time how long it takes to reach a certain voltage. For example, to reach 'V' volts, it can take 'T' nanoseconds. This places a cell in a specific region. This region allows a voltage application component to know some characteristics of a cell component.

Figure 11:
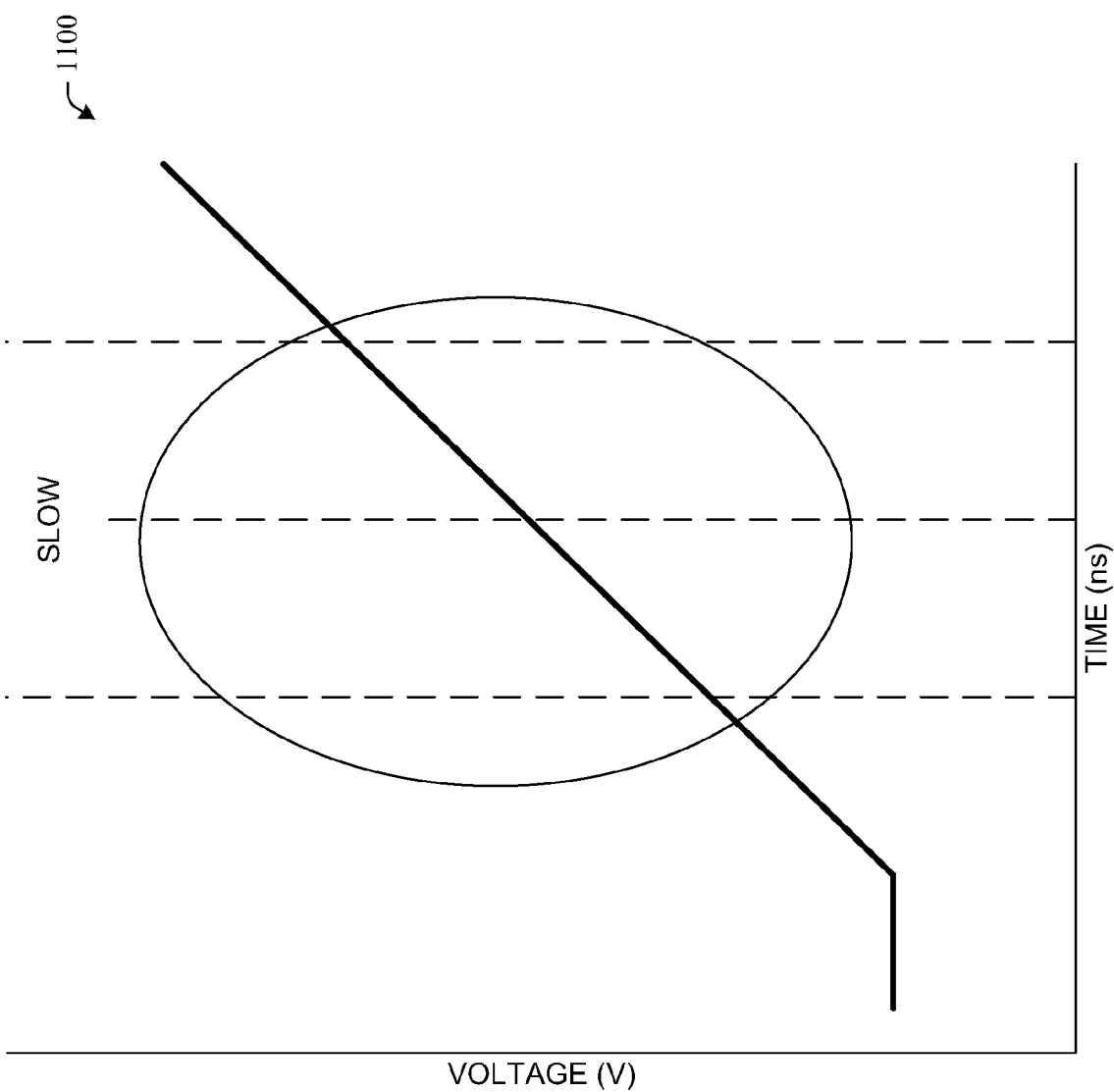
FIG. 11 illustrates a representative graphical representation of cell analysis in accordance with an aspect of the subject specification.

FIG. 11 is a graphical representation of fine voltage application 1100. FIG. 11 can be seen as a narrower region of FIG. 10. This allows for fine-tuning of voltage application. For example, area between dashed end lines of 1100 represents a slow region, which can be the same region as a slow region shown in 1000 of FIG. 10. There can be an offset of a region and a center, which is shown with the three end lines. An oval can be used to assist in showing a graphical representation of a region. This graph represents voltage as a function of time.

Figure 12:
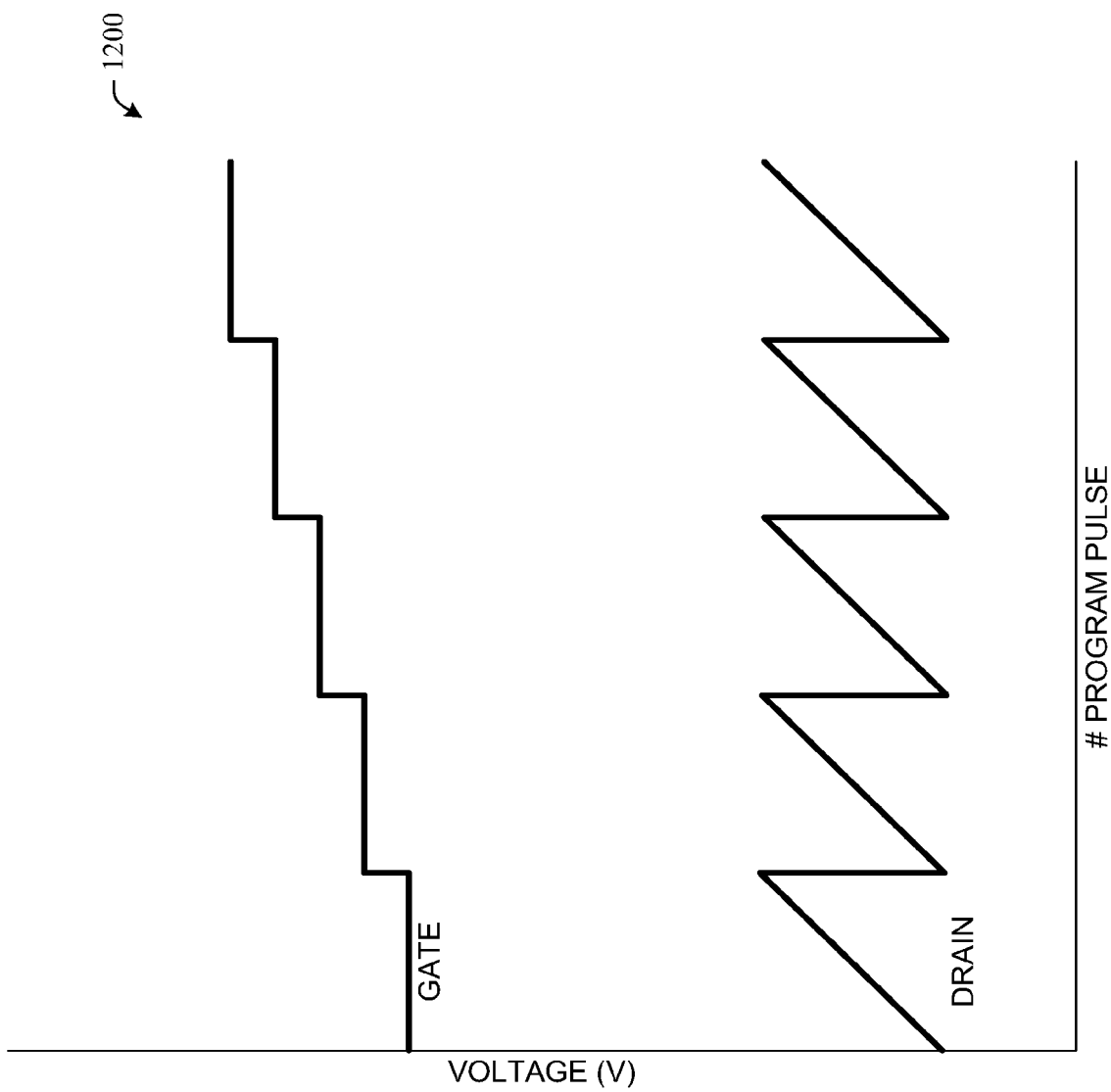
FIG. 12 illustrates a representative graphical representation of cell analysis in accordance with an aspect of the subject specification.

FIG. 12 is a graphical representation of a fine stepping of a state change voltage 1200. Voltages of a drain and a gate can be shown. A number of state change pulses (e.g., programming pulses) are shown with respect to voltage. With each pulse that is applied to a drain, a fixed gate moves incrementally. Application of specific pulses continues until the gate reaches a specific level.

Figure 13:
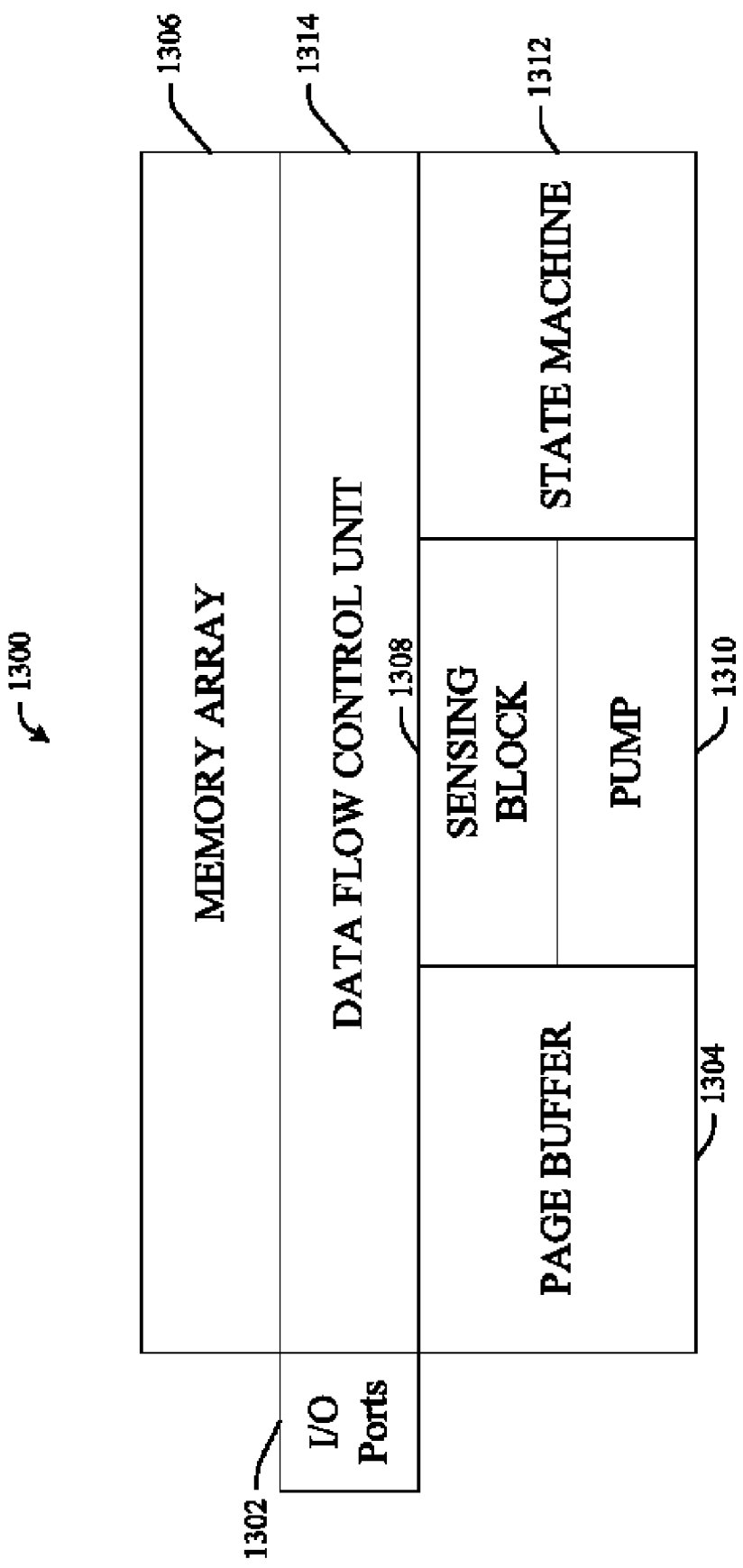
FIG. 13 illustrates a representative flash memory device in accordance with an aspect of the subject specification.

FIG. 13 illustrates an example flash memory device 1300 with components that can integrate with information disclosed in other portions of the subject specification. A flash memory device 1300 has I/O ports 1302 that connect to an auxiliary device (e.g., a personal digital assistant). The I/O port 1302 communicates with the auxiliary device digitally, meaning an I (e.g., high) or an O (e.g., low) represent all data communicated with the flash memory device 1300. This I/O port 1302 can have a several configurations, for example individual metal prongs or a universal serial bus (USB) port. In addition, the I/O port 1302 can contain several components of the subject specification, for example a receiving component 102 of FIG. 1 and/or a notification component 110 of FIG. 1. Another function of the I/O port 1302 is that it can provide power to the flash memory device by drawing power from the auxiliary device in which it connects.

A page buffer 1304 is a temporary holding place for information, such as a command received by the receiving component 102 of FIG. 1. The page buffer 1304 can function during the mapping of the information when retrieved from storage. For example, when accessing a look-up table, table information can be mapped into a page buffer. A common page buffer 1304 employs static random access memory (SRAM). In many flash memory devices 1300, there is a plurality of page buffers 1304. There can be a scratch-pad buffer 1304 that performs temporary storage and FIG. 13 shows this scratch pad buffer 1304 integrated in the general page buffer 1304.

A memory array 1306 is a storage location for a flash memory device 1300. The four-cell component 104 of FIG. 1 can combine to create a memory array. Typically, a memory array 1306 comprises a number of individual cell components that can contain information in bits, with typical cells holding one to four bits for information. It is to be appreciated that information of the subject specification can apply to cell components capable of containing more then four bits of information. In one embodiment, various storage components disclosed in the subject specification integrate into the memory array 1306. In another embodiment, storage component disclosed in the subject specification are independent of the memory array 1306.

A sensing block 1308 functions to monitor overall operations within the flash memory device 1300. For example, a sensing block 1308 can determine is a page buffer 1304 is free before a component sends information to that specific page buffer 1304. As stated earlier, there can be several page buffers. The sensing block can sense how much information is in a page buffer 'A' before sending information to a page buffer 'B'. A pump 1310 provides a high voltage for operations that require such a voltage. For example, some erasing functions require a relatively high level of voltage for proper operation. The pump 1310 can integrate with the voltage application component 106 of FIG. 1 to provide voltages for state changes. A state machine 1312 provides logic functions to the flash memory device 1300. For example, some components only run during certain states. While the state machine 1312 provides a high state, some components are on while others are off and the opposite for a low state.

A data flow control unit 1314 controls many major functions of the flash memory device 1300. Functions generally include writes, reads and erases, as well as several of the functions performed by components of the subject specification. For example, the voltage application component 106 can integrate with the data flow control unit 1314 to allow for state changes. In addition, other components, such as the error check component 502 of FIG. 5 can integrate into the data flow control unit 1314 to determine errors for the flash memory device 1300.

What has been described above includes examples of the subject specification. It is, of course, not possible to describe every conceivable combination of components or methodologies for purposes of describing the subject specification, but one of ordinary skill in the art may recognize that many further combinations and permutations of the subject specification are possible. Accordingly, the subject specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A device, comprising:
a verification voltage device that applies a verification voltage to a memory cell and analyzes impact of the verification voltage on the memory cell to facilitate determining a state change voltage to be applied to change a state of the memory cell; and
a state-change voltage component that references a look-up table, determines the state-change voltage to apply to the memory cell in accordance with information relating to characteristics of the memory cell stored in the look-up table and the analyzed impact on the memory cell in response to the application of the verification voltage to the memory cell, wherein the state-change voltage is a safe amount of voltage as indicated in the look-up table such that when applied to the memory cell will cause minimal or no damage to the memory cell, and applies the voltage corresponding to the state change voltage to the memory cell in order to change the state of the memory cell.

2. The device of claim 1, further comprising an error check component that processes errors relating to voltage application.

3. The device of claim 1, further comprising a timing component that calculates voltage levels against duration.

4. The device of claim 1, further comprising a notification component that transmits information about voltage application.

5. The device of claim 1, wherein during a state-change operation on the memory cell and at least one other memory cell, the state-change voltage component references the look-up table and determines at least one other state-change voltage to apply to the at least one other memory cell in accordance with information in the look-up table and analyzed impact on the at least one other memory cell in response to the application of the verification voltage to the at least one other memory cell, wherein the at least one other state-change voltage is a specified safe amount of voltage such that when applied to the at least one other memory cell will cause minimal or no damage to the at least one other memory cell, and applies the specified voltage corresponding to the at least one other state change voltage to the at least one other memory cell in order to change the state of the at least one other memory cell.

6. The device of claim 5, further comprising a communication component that processes information from the receiving component.

7. The device of claim 1, further comprising a storage component that stores respective information relating to respective characteristics regarding a plurality of respective memory cells, comprising information relating to characteristics about the memory cell, in respective pages in the look-up table in the storage component, wherein the respective information, which relates to the respective characteristics regarding the plurality of respective memory cells, includes respective information that indicates respective state-change voltages that when applied to the respective memory cells will cause minimal or no damage to the respective memory cells.

8. The device of claim 1, further comprising a regulation component that coordinates operation of voltage application.

9. A method comprising:
applying a verification voltage upon a cell component in a memory to determine characteristics of the cell component for application of a state-change voltage upon the cell component;
referencing a look-up table, comprising cell characteristic information relating to cell characteristics of the cell component, to identify a state-change voltage to apply to the cell component in accordance with the determined cell characteristics of the cell component in response to the application of the verification voltage to the cell component, wherein the state-change voltage is an amount of voltage that when applied to the cell component will cause minimal or no damage to the cell component; and
applying the state-change voltage upon the cell component to facilitate changing a state of the cell component.

10. The method of claim 9, further comprising:
storing respective cell characteristic information respectively relating to at least a portion of a plurality of respective cell components associated with the memory, in respective pages in the look-up table, which comprises at least one page containing cell characteristic information respectively relating to the cell component, wherein the respective cell characteristic information comprises information indicating respective safe state-change voltages that when respectively applied to the at least a portion of the respective cell components will cause minimal or no damage to the at least a portion of the respective cell components, comprising at least two respective cell components.

11. The method of claim 9, further comprising:
comparing pre-state-change cell characteristics of the cell component with post-state-change cell characteristics of the cell component to facilitate determining whether the post-state-change cell characteristics are different than the pre-state-change cell characteristics indicating a change in cell characteristics of the cell component, wherein the pre-state-change cell characteristics are cell characteristics of the cell component stored in the look-up table; and
changing the stored cell characteristics to update the look-up table with the post-state-change cell characteristics when change in the cell characteristics of the cell component is determined, wherein the pre-state-change cell characteristics facilitate determination of the amount of voltage that when applied to the cell component will cause minimal or no damage to the cell component, and the post-state-change cell characteristics facilitate determination of another amount of voltage that when applied to the cell component during a subsequent operation will cause minimal or no damage to the cell component.

12. The method of claim 9, further comprising applying the verification voltage more than one time before applying the state-change voltage.

13. The method of claim 9, further comprising determining if the state-change voltage fails.

14. The method of claim 13, further comprising applying a second state-change voltage if there is a failure.

15. The method of claim 9, further comprising determining a range of the verification voltage when applied to the cell component.

16. The method of claim 15, further comprising applying a second verification voltage, wherein the value of the second verification voltage is determined from the range.

17. A device comprising:

means for supplying an evaluation voltage that is applied to a means for holding digital information to facilitate determining characteristics of the means for holding digital information, wherein the determined characteristics are used in determining an amount of a state change voltage to be applied upon the means for holding digital information; and means for providing the state change voltage that is applied to the means for holding digital information, wherein the means for providing references a look-up table, comprising data relating to characteristics of the holding digital information, and determines the amount of the state change voltage to apply to the means for holding digital information based at least in part on information in the look-up table and the determined characteristics on the means for holding digital information in response to the application of the evaluation voltage to the means for holding digital information, wherein the state-change voltage is an amount of voltage that when applied to the means for holding digital information will cause minimal or no damage to the means for holding digital information.

18. The device of claim 17, further comprising means for calculating time of application of voltages applied to the means for holding digital information.

19. The device of claim 18, further comprising means for processing a command to change a state of the means for holding digital information.

20. The device of claim 19, further comprising means for storing characteristics of the means for holding digital information.

* * * * *